(12) United States Patent
Oh et al.

(10) Patent No.: US 8,004,093 B2
(45) Date of Patent: Aug. 23, 2011

(54) INTEGRATED CIRCUIT PACKAGE STACKING SYSTEM

(75) Inventors: JiHoon Oh, Icheon-si (KR); JinGwan Kim, Icheon-si (KR); Jaehyun Lim, Seoul (KR); SunYoung Chun, Icheon-si (KR); KyuWon Lee, Ansung-Si (KR); SinJae Lee, Icheon-si (KR); JongVin Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 24 days.

(21) Appl. No.: 12/185,063

(22) Filed: Aug. 1, 2008

(65) Prior Publication Data

US 2010/0025835 A1    Feb. 4, 2010

(51) Int. Cl.
*H01L 23/48*    (2006.01)
*H01L 23/52*    (2006.01)
*H01L 29/40*    (2006.01)

(52) U.S. Cl. .................. 257/783; 257/782; 438/119

(58) Field of Classification Search .................. 257/686, 257/777, 723, 724, 782, 783, 787, 701; 438/118, 438/119, 107, 109, 110, 127, 125
See application file for complete search history.

(56) References Cited

U.S. PATENT DOCUMENTS

| | | | |
|---|---|---|---|
| 5,222,014 A | 6/1993 | Lin | |
| 5,438,224 A | 8/1995 | Papageorge et al. | |
| 6,774,315 B1 | 8/2004 | Pierson et al. | |
| 6,781,849 B2 * | 8/2004 | Baek et al. | 361/760 |
| 6,861,288 B2 * | 3/2005 | Shim et al. | 438/109 |
| 6,982,869 B2 | 1/2006 | Larson | |
| 7,193,310 B2 | 3/2007 | Roeters et al. | |
| 7,230,328 B2 | 6/2007 | Hazeyama et al. | |
| 7,325,303 B2 | 2/2008 | Boggs et al. | |
| 7,354,800 B2 | 4/2008 | Carson | |
| 7,368,818 B2 | 5/2008 | Kovac et al. | |
| 7,755,178 B2 * | 7/2010 | Hagen et al. | 257/686 |
| 2008/0067662 A1 * | 3/2008 | Roper et al. | 257/686 |
| 2008/0157325 A1 * | 7/2008 | Chow et al. | 257/686 |

* cited by examiner

*Primary Examiner* — S. V Clark
(74) *Attorney, Agent, or Firm* — Mikio Ishimaru

(57) ABSTRACT

An integrated circuit package stacking system includes: forming a flexible substrate by: providing an insulating material, forming a stacking pad on the insulating material, forming a coupling pad on the insulating material, and forming a trace between the stacking pad and the coupling pad; providing a package substrate; coupling an integrated circuit to the package substrate; and applying a conductive adhesive on the package substrate for positioning the flexible substrate over the integrated circuit and coupling the flexible substrate on the conductive adhesive.

18 Claims, 7 Drawing Sheets

US 8,004,093 B2

INTEGRATED CIRCUIT PACKAGE STACKING SYSTEM

TECHNICAL FIELD

The present invention relates generally to integrated circuit packaging, and more particularly to a system for stacking integrated circuit packages.

BACKGROUND ART

Many of today's shrinking consumer electronic devices, such as cellular telephones, digital video cameras, global positioning systems, personal audio/video players, and personal data assistants, require many functions to be packaged in a very small area of a printed wiring board. In attempting to use the area on the printed wiring boards more efficiently, semiconductor chip manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, semiconductor chips are typically interconnected to their supporting substrates using solder connections, such as with "flip-chip" technology. However, when solder alone is used to interconnect the chip contacts to the substrate, the columns of solder are generally designed to be short to maintain the solder's structural integrity. This results in minimal elastic solder connection properties, which further results in increased susceptibility to solder cracking due to the mechanical stress of the differential coefficient of thermal expansion ("CTE") of the chip relative to the supporting substrate, thereby reducing the reliability of the solder joint.

In other words, when the chip heats up during use, both the chip and the substrate expand; and when the heat is removed, both the chip and the substrate contract. The problem that arises is that the chip and the substrate expand and contract at different rates and at different times, thereby stressing the interconnections between them. As the features of semiconductor chips continue to be reduced in size, the number of chips packed into a given area will be greater and the heat dissipated by the each of these chips will have a greater effect on the thermal mismatch problem. This further increases the need for a highly compliant interconnection scheme for the chips.

The solder cracking problem is exacerbated when more than one semiconductor chip is mounted in a package, such as in a multichip module. Multichip modules continue to grow in popularity; however, as more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing overall rigidity of the connection between the module and its supporting substrate.

Another issue for the multichip modules is manufacturability. As the number of integrated circuits in the package increases, it becomes more difficult to achieve good manufacturing yields. A single failed component included in the stack will make the entire stack bad. With the increasing number of functions included in the most popular consumer electronic devices, it becomes imperative that the manufacturing yield be optimized.

Thus, a need still remains for an integrated circuit package stacking system. In view of the constant demand for more functions in less space on the printed wiring boards, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package stacking system including: forming a flexible substrate by: providing an insulating material, forming a stacking pad on the insulating material, forming a coupling pad on the insulating material, and forming a trace between the stacking pad and the coupling pad; providing a package substrate; coupling an integrated circuit to the package substrate; and applying a conductive adhesive on the package substrate for positioning the flexible substrate over the integrated circuit and coupling the flexible substrate on the conductive adhesive.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
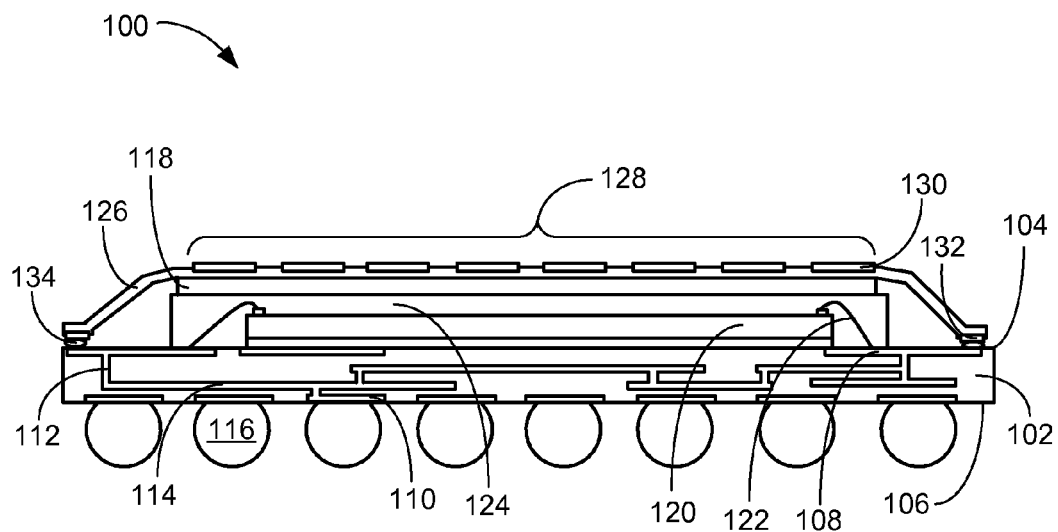
FIG. 1 is a cross-sectional view of an integrated circuit package stacking system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package stacking system 100, in an embodiment of the present invention. The cross-sectional view of the integrated circuit package stacking system 100 depicts a package substrate 102, having a component side 104 and a system side 106. Component contacts 108 on the component side 104 may be electrically connected to system contacts 110 on the system side 106 by vias 112 and internal layers 114. System interconnects 116 may be formed on the system contacts 110 for connecting to the next level system (not shown).

An adhesive 118, such as a die attach material or an adhesive epoxy, may be applied on the component side 104 for mounting an integrated circuit 120. The integrated circuit 120, such as a wire bond type, may be coupled to the component contacts 108 by electrical interconnects 122. A package body 124 may be formed on the component side 104, the adhesive 118, the integrated circuit 120, and the electrical interconnects 122.

A flexible substrate 126 may be mounted over the integrated circuit 120 and electrically connected to the package substrate 102. A layer of the adhesive 118 may be applied between the package body 124 and the flexible substrate 126.

An array 128 of stacking pads 130 may be formed in the top of the flexible substrate 126. Coupling pads 132 may be formed near the edges of the flexible substrate 126. The coupling pads 132 may be electrically connected to the component contacts 108 by a conductive adhesive 134, such as solder paste or conductive epoxy. The stacking pads 130 may be electrically connected to the coupling pads 132 for forming circuits, such as a plurality of signal connections through the flexible substrate, between the stacking pads 130, the integrated circuit 120, the system interconnects 116, or a combination thereof. Any electrical connection between the integrated circuit 120 and the stacking pads 130 may be made through the package substrate 102.

Figure 2:
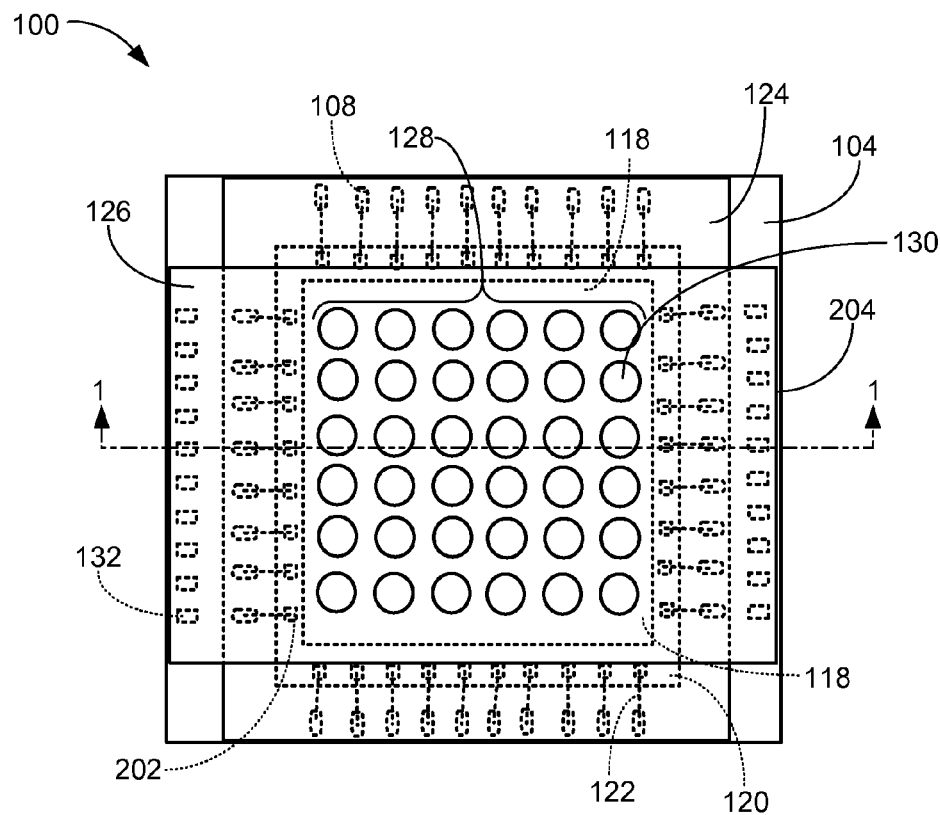
FIG. 2 is a plan view of the integrated circuit package stacking system of FIG. 1.

Referring now to FIG. 2, therein is shown a plan view of the integrated circuit package stacking system 100, of FIG. 1. The plan view of the integrated circuit package stacking system 100 depicts the integrated circuit 120, mounted on the component side 104, having input/output pads 202 coupled to the component contacts 108 by the electrical interconnects 122. The package body 124 may be formed on the component side 104, the component contacts 108, the integrated circuit 120, and the electrical interconnects 122.

The adhesive 118 may be applied on the package body 124 with the flexible substrate 126 mounted thereon. The coupling pads 132 may all be attached in a single tape automated bonding (TAB) operation. In packages that have a high number of the coupling pads 132, this may represent a significant saving of time over prior art bonding operations. The array 128 of the stacking pads 130 may provide a connection platform for an additional package (not shown). The section line 1-1 depicts the position and direction of view of the cross-section of FIG. 1.

The number and position of the input/output pads 202 is an example only and the actual number and position may differ. The shape of the array 128 and the number and shape of the stacking pads 130 is also an example and may differ in the actual implementation. The coupling pads 132 are shown along an edge 204 of the flexible substrate 126, but this is also an example since the coupling pads 132 may be formed on any portion of the flexible substrate 126.

Figure 3:
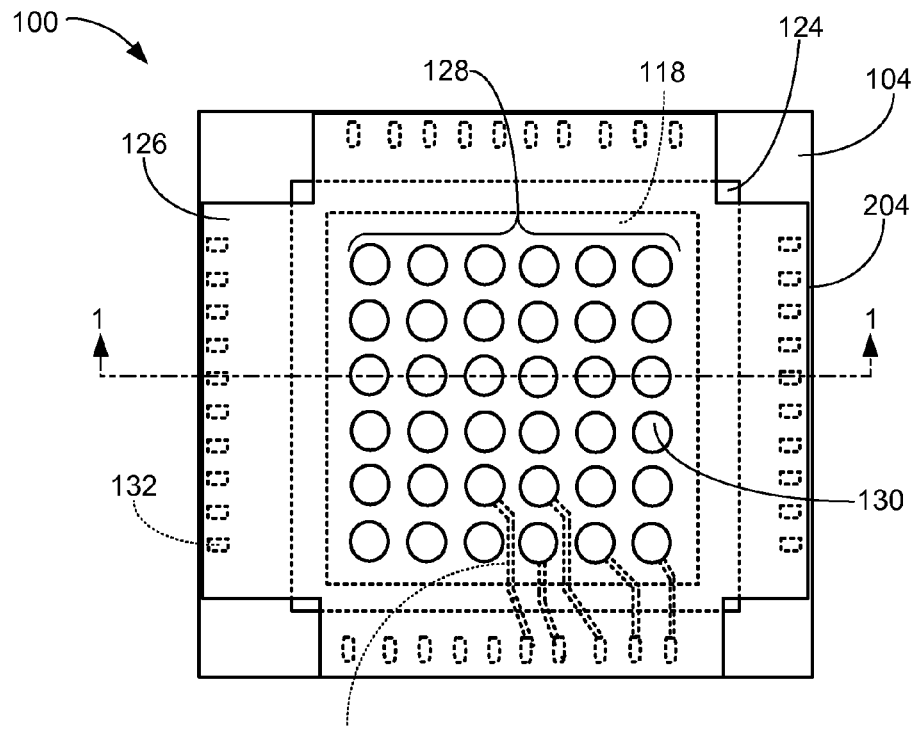
FIG. 3 is a plan view of the integrated circuit package stacking system, of FIG. 1, in an alternative embodiment of the present invention.

Referring now to FIG. 3, therein is shown a plan view of the integrated circuit package stacking system 100, of FIG. 1, in an alternative embodiment of the present invention. The plan view of the integrated circuit package stacking system 100 depicts the package body 124 formed on the component side 104. The adhesive 118 may be positioned on the package body 124 in order to support the array 128 of the stacking pads 130. The flexible substrate 126 may be mounted over the package body 124 and the component side 104.

In this example, the coupling pads 132 are aligned along four of the edges 204. The number of electrical connections possible may only be limited by the layout accuracy of the flexible substrate 126. Traces 302 may be formed in the inner layers of the flexible substrate 126. It is also possible that additional layers (not shown) may supply ground shielding or voltage distribution. The traces 302 may be significantly wider than the electrical interconnects 122, of FIG. 1. This additional width and the possibility of a shielding layer may provide a significant improvement in the high frequency performance of the package stack (not shown).

The traces 302 of the flexible substrate 126 may provide a better thermal path between the package substrate 102, of FIG. 1, and any stacked package (not shown) than is possible in prior art packages. The traces 302 shown in FIG. 3 are an example only and other configurations of the traces 302 are possible. In an actual implementation all of the stacking pads 130 may be coupled to the coupling pads 132 by the traces 302.

Figure 4:
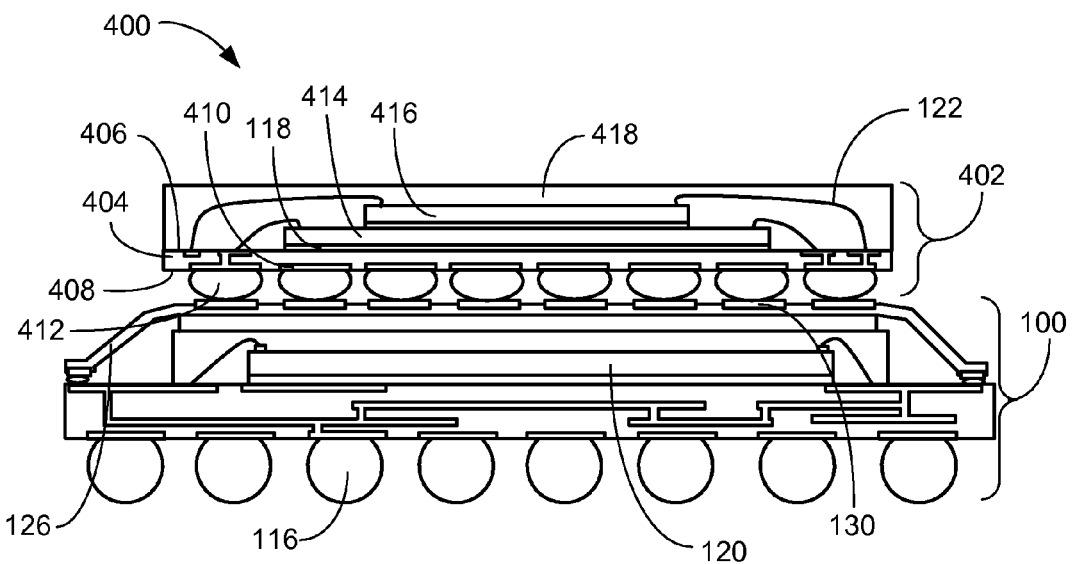
FIG. 4 is a cross-sectional view of an integrated circuit package stack, substantially similar to FIG. 1.

Referring now to FIG. 4, therein is shown a cross-sectional view of an integrated circuit package stack 400, substantially similar to FIG. 1. The cross-sectional view of the integrated circuit package stack 400 depicts the integrated circuit package stacking system 100 having a stacked package 402 mounted thereon. The stacked package 402 may include a stacked substrate 404 having a chip side 406 and a coupling side 408. There may be contacts 410, on the coupling side 408, with chip interconnects 412 formed thereon. The chip interconnects 412 may be coupled to the stacking pads 130 of the flexible substrate 126.

A first stacked integrated circuit 414 may be mounted, on the chip side 406 of the stacked substrate 404, by the adhesive 118. A second stacked integrated circuit 416 may be mounted above the first stacked integrated circuit 414. The first stacked integrated circuit 414 and the second stacked integrated circuit 416 may be coupled to the chip side 406 by the electrical interconnects 122. This configuration may provide electrical interconnections between the first stacked integrated circuit 414, the second stacked integrated circuit 416, the integrated circuit 120, the system interconnects 116, or a combination thereof. A stacked package body 418 may be formed, of an epoxy molding compound, on the chip side 406, the first stacked integrated circuit 414, the second stacked integrated circuit 416, and the electrical interconnects 122.

The stacked package 402 is shown as a ball grid array package, but this is for an example only and other types of integrated circuit packages may be used. The flexible substrate 126 may provide relief from the solder cracking issue that plagues prior art stacked packages. The flexible substrate may deform slightly without damaging the traces 302, of FIG. 3. This deformation may resolve the CTE differences between the stacked package 402 and the integrated circuit package stacking system 100.

In a manufacturing environment, the flexible substrate 126 may allow several different package types of the stacked package 402 to be adapted to the same base package with no changes required for the base package. By changing the position, shape or the combination thereof of the stacking pads 130 other functions or types of packages may be incorporated in the integrated circuit package stack 400.

It has been unexpectedly discovered that the integrated circuit package stacking system 100, of the present invention may provide a solution to the solder cracking issue caused by different coefficients of thermal expansion (CTE's) in a package stack. This discovery was complemented by the manufacturing yield enhancement delivered by assembling tested and known good parts. The flexible substrate 126 may deliver improved electrical performance due to the ability to control the impedance of the traces 302 as opposed to wire bonding which can not control the impedance.

Figure 5:
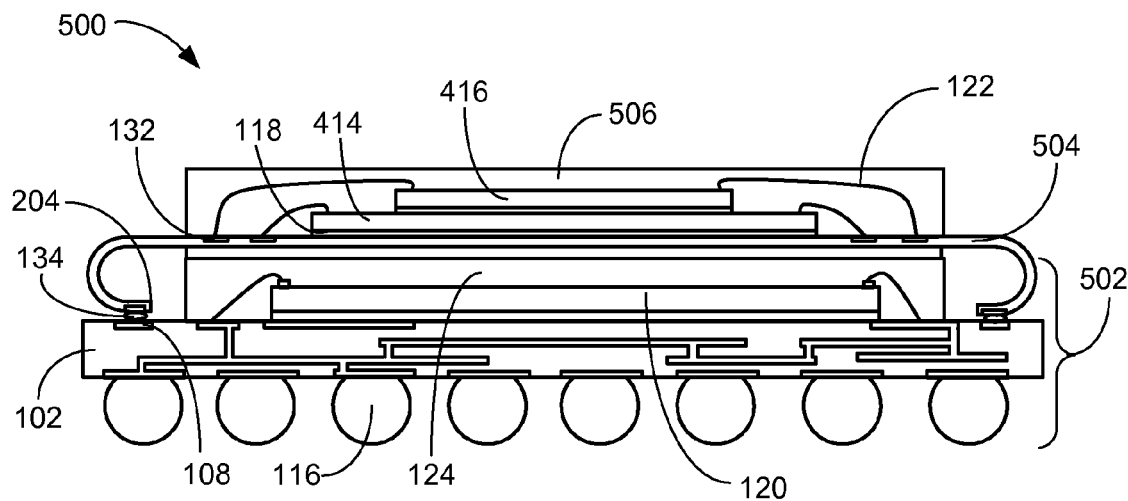
FIG. 5 is a cross-sectional view of an integrated circuit package stack in a second alternative embodiment of the present invention, substantially similar to FIG. 1.

Referring now to FIG. 5, therein is shown a cross-sectional view of an integrated circuit package stack 500 in a second alternative embodiment of the present invention, substantially similar to FIG. 1. The cross-sectional view of the integrated circuit package stack 500 depicts a base package 502 including the package substrate 102 with the integrated circuit 120 coupled thereto by the electrical interconnects 122. The package body 124 may be formed on the package substrate 102, the integrated circuit 120 and the electrical interconnects 122.

A flexible substrate 504 may be mounted over the base package 502 by the adhesive 118. The flexible substrate 504 may have the first stacked integrated circuit 414 mounted by the adhesive 118. The flexible substrate 504 may have the coupling pads 132 arranged around the first stacked integrated circuit 414 as well as near the edge 204. The second stacked integrated circuit 416 may be mounted over the first stacked integrated circuit 414 by the adhesive 118.

The electrical interconnects 122 may electrically connect the first stacked integrated circuit 414 and the second stacked integrated circuit 416 to the coupling pads 132 arranged around the first stacked integrated circuit 414. The flexible substrate 504 may be formed in a semicircular shape in order to align the coupling pads 132 near the edge 204 with the component contacts 108 on the package substrate 102 to which they are attached. The conductive adhesive 134 may connect the coupling pad 132 to the component contact 108. A stacked package body 506 may be formed on the flexible substrate 504, the first stacked integrated circuit 414, the second stacked integrated circuit 416, and the electrical interconnects 122.

It has been discovered that this configuration of the integrated circuit package stack 500 may provide a reduced package height while allowing the base package 502 to be tested independently from the first stacked integrated circuit 414 and the second stacked integrated circuit 416. The integrated circuit package stack 500 may provide a way to electrically connect the integrated circuit 120, the first stacked integrated circuit 414, the second stacked integrated circuit 416, the system interconnects 116, or a combination thereof.

Figure 6:
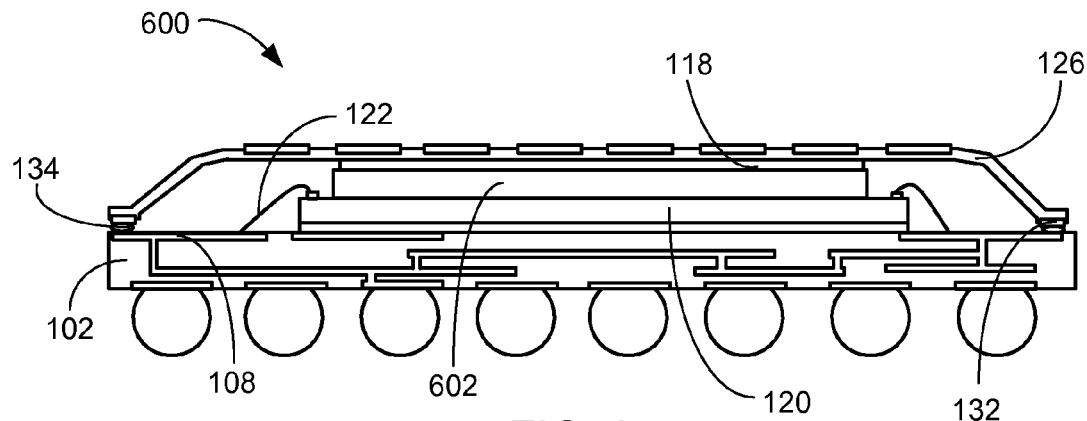
FIG. 6 is a cross-sectional view of an integrated circuit package stacking system in an alternative embodiment of the present invention.

Referring now to FIG. 6, therein is shown a cross-sectional view of an integrated circuit package stacking system 600 in an alternative embodiment of the present invention. The cross-sectional view of the integrated circuit package stacking system 600 depicts the package substrate 102 with the integrated circuit 120 mounted by the adhesive 118 and coupled to the package substrate 102 by the electrical interconnects 122. A spacer 602, such as an integrated circuit spacer, is positioned on the integrated circuit 120. The adhesive 118 may be applied on the spacer 602 with the flexible substrate 126 mounted on the adhesive 118.

The flexible substrate 126 may have the coupling pads 132 electrically connected to the component contacts 108 by the conductive adhesive 134. The spacer 602 may provide a vertical clearance between the electrical interconnects 122 and the flexible substrate 126.

This configuration is an intermediate step of manufacture and additional components are required in order to attach a stacked package (not shown). This configuration may provide a low package profile in the final manufacturing steps.

Figure 7:
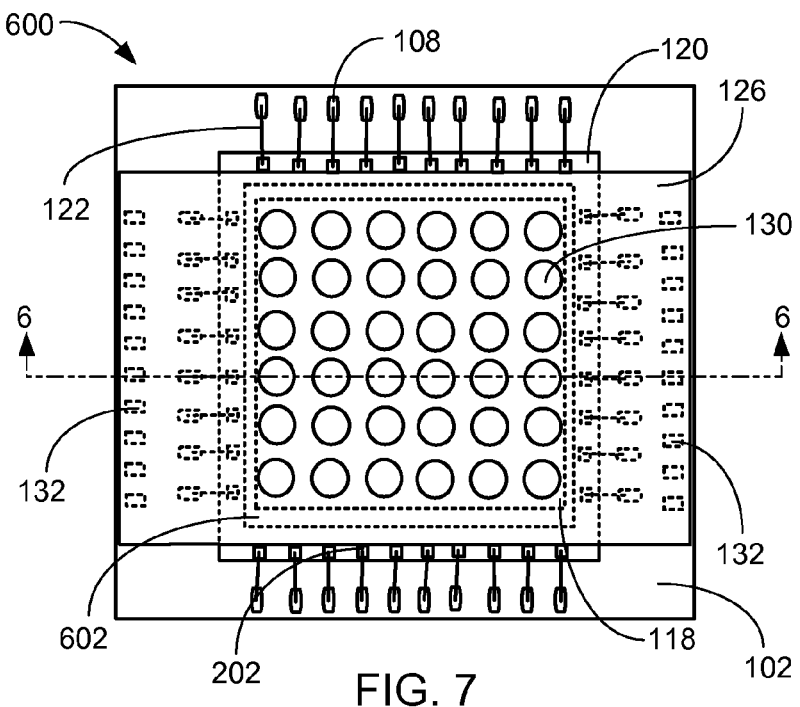
FIG. 7 is a plan view of the integrated circuit package stacking system, of FIG. 6.

Referring now to FIG. 7, therein is shown a plan view of the integrated circuit package stacking system 600, of FIG. 6. The plan view of the integrated circuit package stacking system 600 depicts the package substrate 102 with the integrated circuit 120 having the input/output pads 202 coupled to the component contacts 108 by the electrical interconnects 122. The spacer 602, such as an integrated circuit spacer, is positioned on the integrated circuit 120. The adhesive 118 may be applied on the spacer 602 with the flexible substrate 126 mounted on the adhesive 118.

The flexible substrate 126 may have the coupling pads 132 electrically connected to the component contacts 108. The spacer 602 may provide a vertical clearance between the electrical interconnects 122 and the flexible substrate 126. The stacking pads 130 may be arranged across the surface of the flexible substrate 126. The number and position of the input/output pads 202 is an example only and the actual number and position may differ. The section line 6-6 shows the position and direction of view as shown in FIG. 6.

Figure 8:
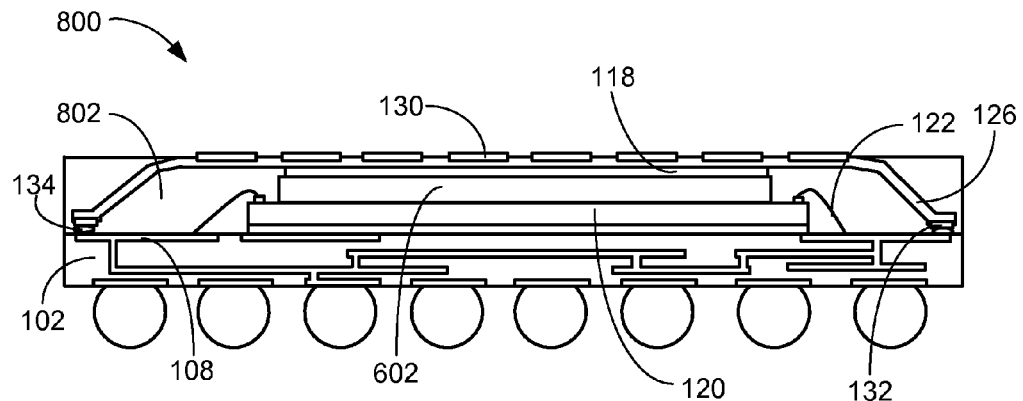
FIG. 8 is a cross-sectional view of an integrated circuit package stacking system in a second alternative embodiment of the present invention.

Referring now to FIG. 8, therein is shown a cross-sectional view of an integrated circuit package stacking system 800 in a second alternative embodiment of the present invention. The cross-sectional view of the integrated circuit package stacking system 800 depicts the package substrate 102 with the integrated circuit 120 mounted by the adhesive 118 and coupled to the package substrate 102 by the electrical interconnects 122. The spacer 602, such as an integrated circuit spacer, is positioned on the integrated circuit 120. The adhesive 118 may be applied on the spacer 602 with the flexible substrate 126 mounted on the adhesive 118.

The flexible substrate 126 may have the coupling pads 132 electrically connected to the component contacts 108 by the conductive adhesive 134. The spacer 602 may provide a vertical clearance between the electrical interconnects 122 and the flexible substrate 126.

A package body 802 may be formed, of an epoxy molding compound, on the package substrate 102, the integrated circuit 120, the electrical interconnects 122, the adhesive 118, the spacer 602, and the flexible substrate 126. The surface of the package body 802 may be coplanar with the top surface of the flexible substrate 126. The stacking pads 130 remain exposed and available for coupling a stacked package (not shown).

Figure 9:
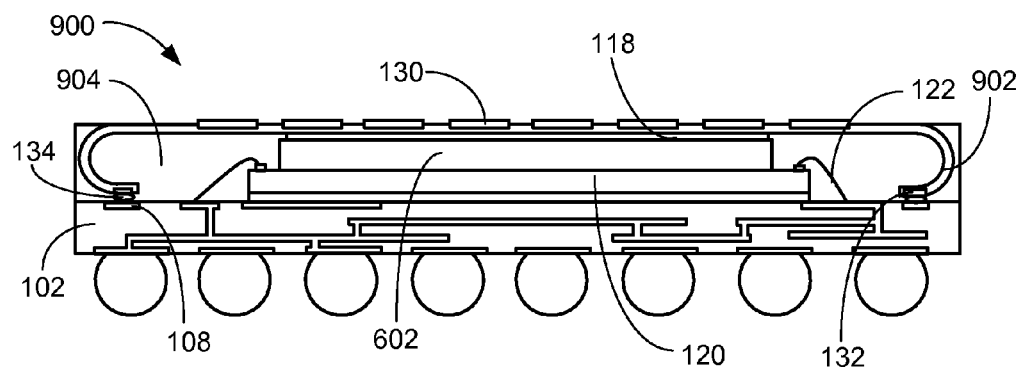
FIG. 9 is a cross-sectional view of an integrated circuit package stacking system in a third alternative embodiment of the present invention.

Referring now to FIG. 9, therein is shown a cross-sectional view of an integrated circuit package stacking system 900 in a third alternative embodiment of the present invention. The cross-sectional view of the integrated circuit package stacking system 900 depicts the package substrate 102 with the integrated circuit 120 mounted by the adhesive 118 and coupled to the package substrate 102 by the electrical interconnects 122. The spacer 602, such as an integrated circuit spacer, is positioned on the integrated circuit 120. The adhesive 118 may be applied on the spacer 602 with a flexible substrate 902 mounted on the adhesive 118.

The flexible substrate 902 may have the coupling pads 132 electrically connected to the component contacts 108 by the conductive adhesive 134. The spacer 602 may provide a vertical clearance between the electrical interconnects 122 and the flexible substrate 902.

A package body 904 may be formed, of an epoxy molding compound, on the package substrate 102, the integrated circuit 120, the electrical interconnects 122, the adhesive 118, the spacer 602, and the flexible substrate 902. The surface of the package body 904 may be coplanar with the top surface of the flexible substrate 902. The stacking pads 130 remain exposed and available for coupling a stacked package (not shown).

Figure 10:
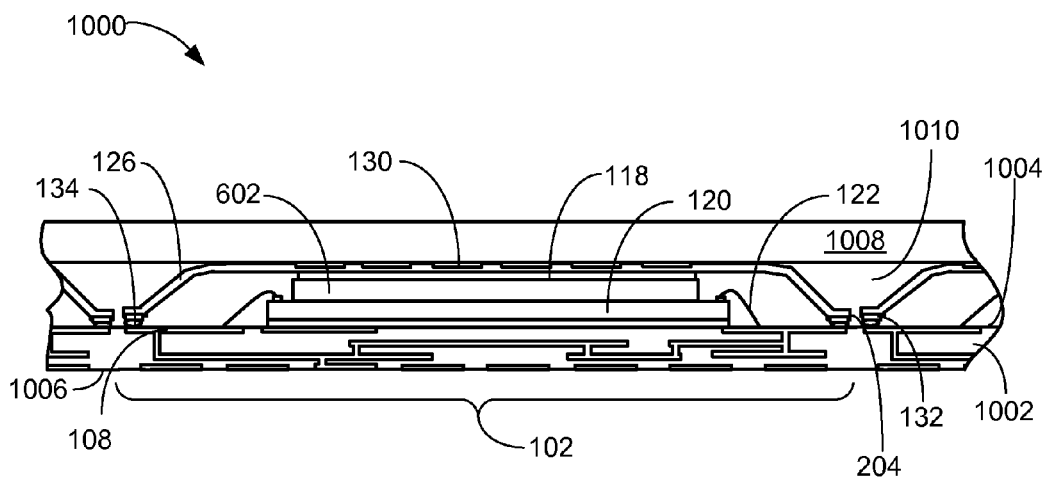
FIG. 10 is a cross-sectional view of an integrated circuit package stacking system in a molding phase of manufacturing.

Referring now to FIG. 10, therein is shown a cross-sectional view of an integrated circuit package stacking system 1000 in a molding phase of manufacturing. The cross-sectional view of the integrated circuit package stacking system 1000 depicts a substrate panel 1002 having a component side 1004 and a system side 1006. The substrate panel 1002 may have the package substrate 102 patterned throughout. The adhesive 118 may be applied to each of the patterned copies of the package substrate 102. The integrated circuit 120 may be mounted on each of the adhesive 118. The electrical interconnects 122 may couple each of the integrated circuit 120 to an appropriate set of the component contact 108 within the package substrate 102.

The spacer 602 may be mounted on each of the integrated circuit 120 that may be coupled to the substrate panel 1002. The flexible substrate 126 may be positioned over the spacer 602 and coupled to an appropriate set of the component contact 108 within the package substrate 102. The coupling pads 132 may be electrically connected to the component contact 108 by the conductive adhesive 134.

During the molding process, a mold chase 1008 is placed on the flexible substrate 126 to prevent encapsulation of the stacking pads 130. A molding compound 1010 may be injected between the substrate panel 1002 and the mold chase 1008. The molding compound may be on the component side 1004, the integrated circuit 120, the spacer 602, the electrical interconnects 122, the adhesive 118, and the flexible substrate 126 including the edge 204. In a subsequent process step, the integrated circuit package stacking system 1000 may be singulated along the boundaries of the patterned instances of the package substrate 102.

Figure 11:
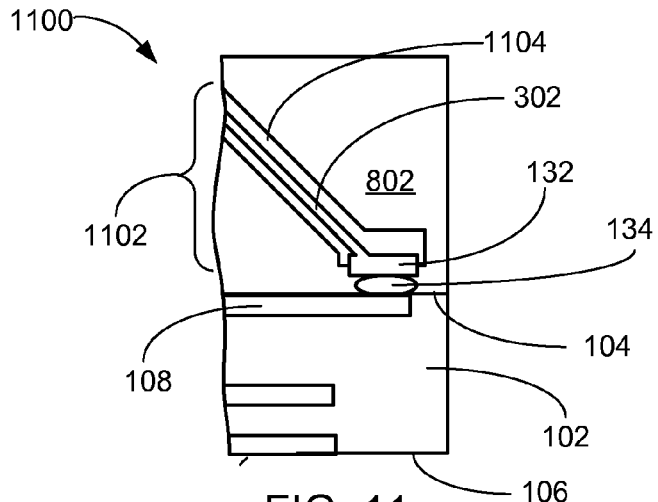
FIG. 11 is a magnified cross-sectional view of a flexible substrate coupling system, in an embodiment of the present invention.

Referring now to FIG. 11, therein is shown a magnified cross-sectional view of a flexible substrate coupling system 1100, in an embodiment of the present invention. The cross-sectional view of the flexible substrate coupling system 1100 depicts the package substrate 102 having the component side 104 and the system side 106. The component contact 108 may be formed on the component side 104.

A flexible substrate 1102 may have the coupling pad 132 electrically connected to the component contact 108 by the conductive adhesive 134. The trace 302 may be electrically connected to the coupling pad 132. An insulating material 1104, such as a Kapton layer, may be formed on the trace 302 and the coupling pad 132. A portion of the coupling pad 132 may be left exposed for further connection. The package body 802 may be formed on the flexible substrate 1102, the conductive adhesive 134, and the component side 104.

Figure 12:
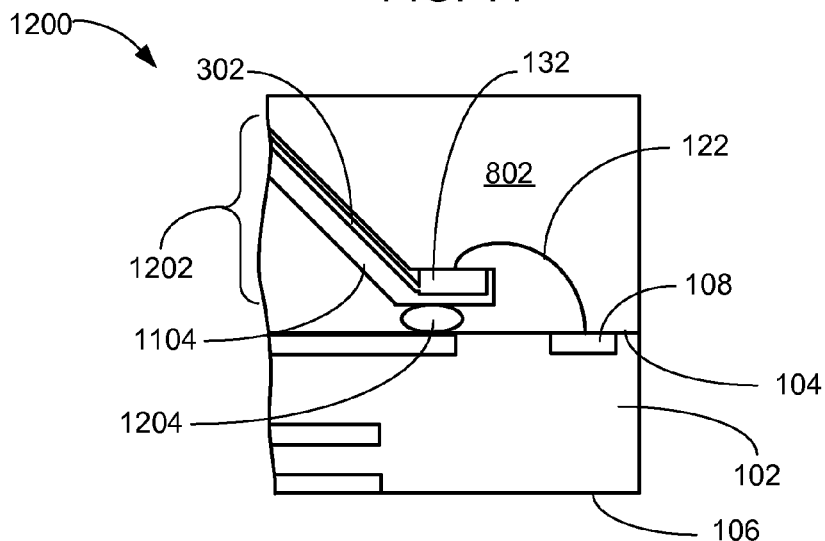
FIG. 12 is a magnified cross-sectional view of a flexible substrate coupling system, in an alternative embodiment of the present invention.

Referring now to FIG. 12, therein is shown a magnified cross-sectional view of a flexible substrate coupling system 1200, in an alternative embodiment of the present invention. The cross-sectional view of the flexible substrate coupling system 1200 depicts the package substrate 102 having the component side 104 and the system side 106. The component contact 108 may be formed on the component side 104.

A flexible substrate 1202 may have the coupling pad 132 electrically connected to the component contact 108 by the electrical interconnect 122. A non-conductive adhesive material 1204, such as a die attach material, or insulating epoxy, may be applied between the component side 104 and the flexible substrate 1202. The trace 302 may be electrically connected to the coupling pad 132. The insulating material 1104, such as a Kapton layer, may be formed on the trace 302 and the coupling pad 132. A portion of the coupling pad 132 may be left exposed for further connection. The package body 802 may be formed on the flexible substrate 1202, the electrical interconnect 122, the non-conductive adhesive material 1204, and the component side 104.

Figure 13:
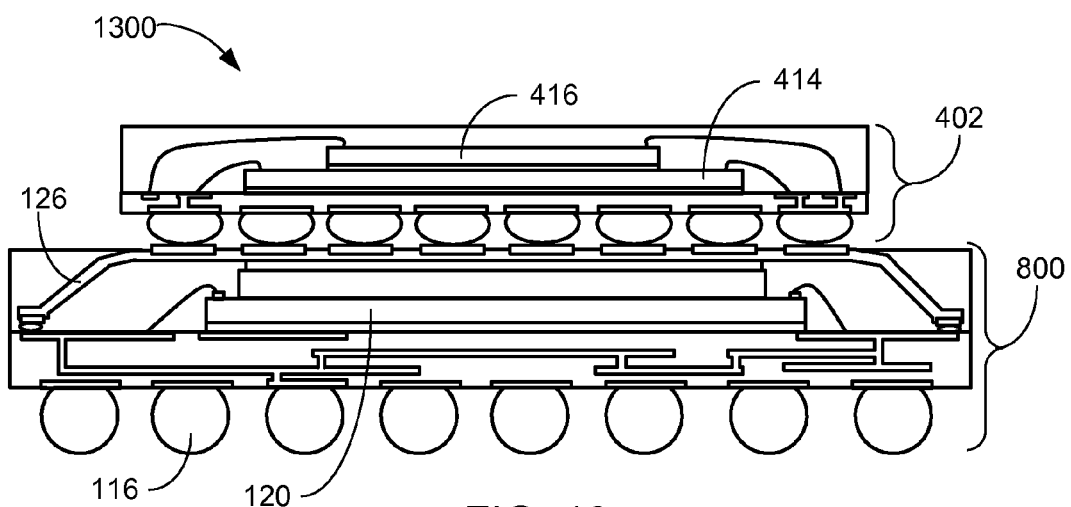
FIG. 13 is a cross-sectional view of an integrated circuit package stack in a fifth alternative embodiment of the present invention.

Referring now to FIG. 13, therein is shown a cross-sectional view of an integrated circuit package stack 1300 in a fifth alternative embodiment of the present invention. The cross-sectional view of the integrated circuit package stack 1300 depicts the integrated circuit package stacking system 800 with the stacked package 402 mounted thereon. This configuration may provide good manufacturing yield because both packages can be tested prior to final assembly. A signal path may be established through the flexible substrate 126 for signaling between the integrated circuit 120, the first stacked integrated circuit 414, the second stacked integrated circuit 416, the system interconnects 116, or a combination thereof.

Figure 14:
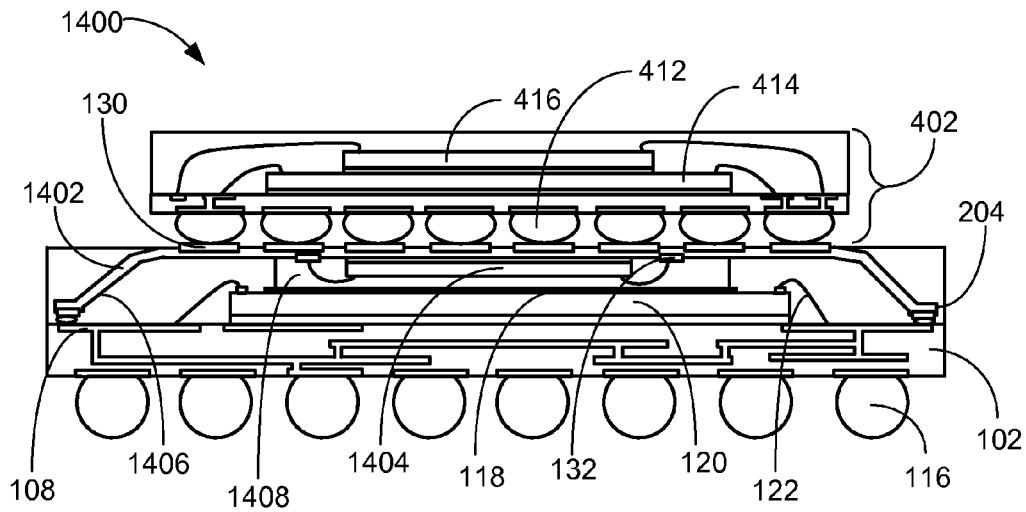
FIG. 14 is a cross-sectional view of an integrated circuit package stack in a sixth alternative embodiment of the present invention.

Referring now to FIG. 14, therein is shown a cross-sectional view of an integrated circuit package stack 1400 in a sixth alternative embodiment of the present invention. The cross-sectional view of the integrated circuit package stack 1400 depicts the package substrate 102 having the integrated circuit 120 mounted by the adhesive 118. The electrical interconnects 122 may electrically connect the integrated circuit to the component contacts 108 on the package substrate 102.

A flexible substrate 1402 may have an embedded integrated circuit 1404, such as a wire bond type, mounted by the adhesive 118 on an embedded side 1406. The electrical interconnects 122 may be coupled between the embedded integrated circuit 1404 and the coupling pads 132 on the embedded side 1406. A molded cap 1408 may be formed, on the embedded integrated circuit 1404, the electrical interconnects 122, and the coupling pads 132, by molding an epoxy molding compound. The molded cap 1408 may be mounted to the integrated circuit 120 by the adhesive 118.

The flexible substrate 1402 may be coupled to the package substrate 102 by the coupling pads 132, near the edge 204, connected to the component contacts 108 on the package substrate 102. The embedded integrated circuit 1404, having been coupled to the flexible substrate 1402, can be positioned between the flexible substrate 1402 and the integrated circuit 120. The stacked package 402 may be mounted to the flexible substrate 1402 by the chip interconnects 412 reflowed to the stacking pads 130. In this manner electrical connections may be formed between the integrated circuit 120, the embedded integrated circuit 1404, the first stacked integrated circuit 414, the second stacked integrated circuit 416, the system interconnects 116, or a combination thereof.

Figure 15:
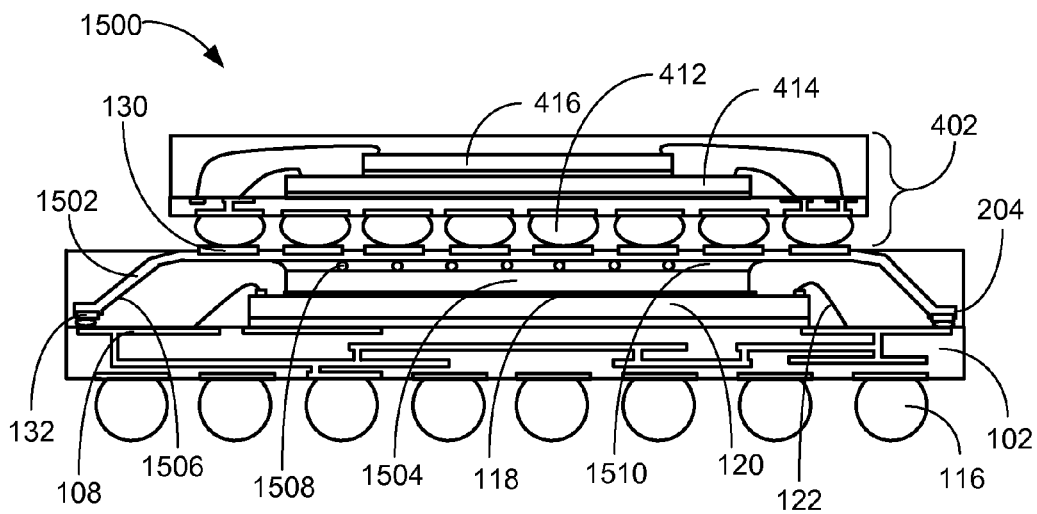
FIG. 15 is a cross-sectional view of an integrated circuit package stack in a seventh alternative embodiment of the present invention.

Referring now to FIG. 15, therein is shown a cross-sectional view of an integrated circuit package stack 1500 in a seventh alternative embodiment of the present invention. The cross-sectional view of the integrated circuit package stack 1500 depicts the package substrate 102 having the integrated circuit 120 mounted by the adhesive 118. The electrical interconnects 122 may electrically connect the integrated circuit to the component contacts 108 on the package substrate 102.

A flexible substrate 1502 may have an embedded flip chip circuit 1504, such as a flip chip type of integrated circuit, mounted on an embedded side 1506. Integrated circuit interconnects 1508 may be coupled between the embedded flip chip circuit 1504 and the coupling pads 132 on the embedded side 1506. A sealing material 1510, such as an underfill material, may be formed, on the embedded flip chip circuit 1504, the integrated circuit interconnects 1508, and the coupling pads 132. Some of the coupling pads 132 are not shown in order to simplify the figure. The inactive side of the embedded flip chip circuit 1504 may be mounted to the integrated circuit 120 by the adhesive 118.

The flexible substrate 1502 may be coupled to the package substrate 102 by the coupling pads 132, near the edge 204, connected to the component contacts 108 on the package substrate 102. The stacked package 402 may be mounted to the flexible substrate 1502 by the chip interconnects 412 reflowed to the stacking pads 130. In this manner electrical connections may be formed between the integrated circuit 120, the embedded flip chip circuit 1504, the first stacked integrated circuit 414, the second stacked integrated circuit 416, the system interconnects 116, or a combination thereof.

Figure 16:
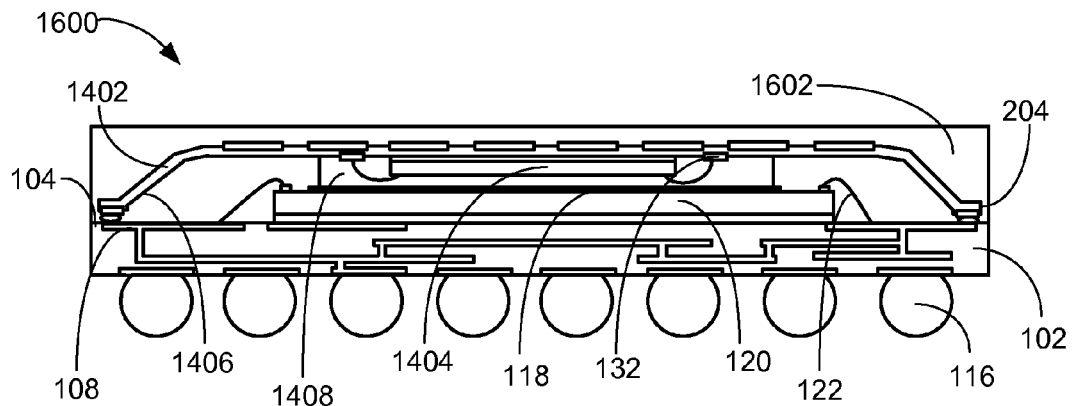
FIG. 16 is a cross-sectional view of an integrated circuit package stack in an eighth alternative embodiment of the present invention.

Referring now to FIG. 16, therein is shown a cross-sectional view of an integrated circuit package stack 1600 in an eighth alternative embodiment of the present invention. The cross-sectional view of the integrated circuit package stack 1600 depicts the package substrate 102 having the integrated circuit 120 mounted by the adhesive 118. The electrical interconnects 122 may electrically connect the integrated circuit to the component contacts 108 on the package substrate 102.

The flexible substrate 1402 may have the embedded integrated circuit 1404, such as a wire bond type, mounted by the adhesive 118 on the embedded side 1406. The electrical interconnects 122 may be coupled between the embedded integrated circuit 1404 and the coupling pads 132 on the embedded side 1406. The molded cap 1408 may be formed, on the embedded integrated circuit 1404, the electrical interconnects 122, and the coupling pads 132, by molding an epoxy molding compound. The molded cap 1408 may be mounted to the integrated circuit 120 by the adhesive 118.

The flexible substrate 1402 may be coupled to the package substrate 102 by the coupling pads 132, near the edge 204, connected to the component contacts 108 on the package substrate 102. A package body 1602 may enclose the flexible substrate 1402, the integrated circuit 120, the electrical interconnects 122, and the component side 104 of the package substrate 102. The package body 1602 may be formed of an epoxy molding compound for providing a package-in-package structure without having to re-design the package electronics. In this manner electrical connections may be formed between the integrated circuit 120, the embedded integrated circuit 1404, the system interconnects 116, or a combination thereof.

Figure 17:
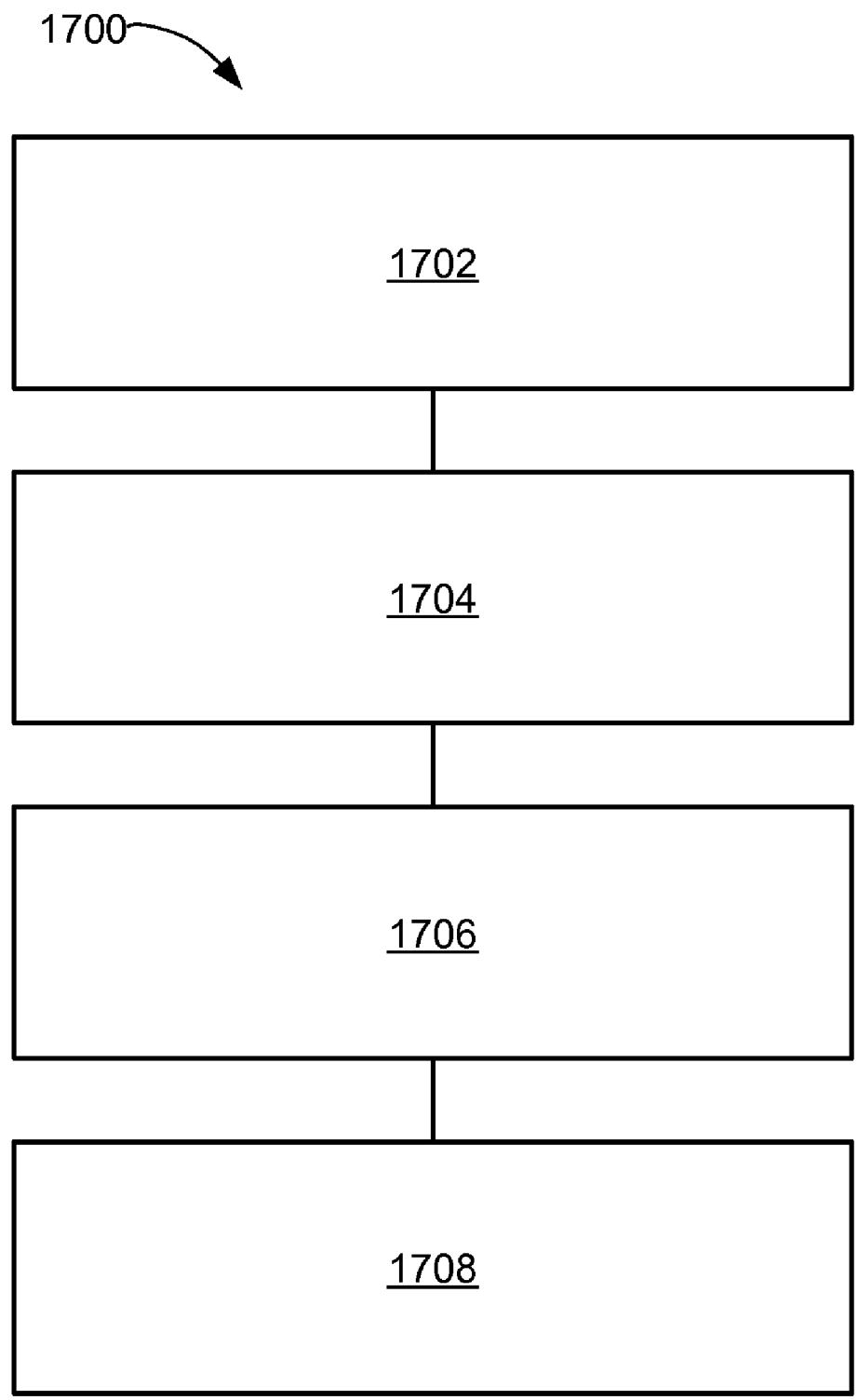
FIG. 17 is a flow chart of an integrated circuit package stacking system for manufacturing the integrated circuit package stacking system in an embodiment of the present invention.

Referring now to FIG. 17, therein is shown a flow chart of an integrated circuit package stacking system 1700 for manufacturing the integrated circuit package stacking system 100 in an embodiment of the present invention. The system 1700 includes forming a flexible substrate by: providing an insulating material, forming a stacking pad on the insulating material, forming a coupling pad on the insulating material, and forming a trace between the stacking pad and the coupling pad in a block 1702; providing a package substrate in a block 1704; coupling an integrated circuit to the package substrate in a block 1706; and applying a conductive adhesive on the package substrate for positioning the flexible substrate over the integrated circuit and coupling the flexible substrate on the conductive adhesive in a block 1708.

It has been discovered that the present invention thus has numerous aspects.

An aspect that has been unexpectedly discovered is that the present invention may provide flexibility in joining different package types in a stacked configuration without re-designing the package substrate.

Another aspect is that the present invention may provide an integrated circuit package stacking system for package-on-package or package-in-package configurations without changing the electrical connections.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package stacking system of the present invention furnishes important and heretofore unknown and unavailable solutions, capabilities, and functional aspects for manufacturing multiple integrated circuit packages with stacked packages. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package stacking system comprising:
   forming a flexible substrate by:
      providing an insulating material,
      forming an array of stacking pads on the insulating material,
      forming coupling pads on the insulating material, and
      forming traces between the stacking pads and the coupling pads including electrically connecting one of the stacking pads to one of the coupling pads for forming a circuit;
   providing a package substrate;
   coupling an integrated circuit to the package substrate;
   coupling an embedded integrated circuit to the flexible substrate including the embedded integrated circuit between the flexible substrate and the integrated circuit; and
   applying a conductive adhesive on the package substrate for positioning the flexible substrate over the integrated circuit and coupling the flexible substrate on the conductive adhesive including forming a plurality of electrical connections through the flexible substrate between the stacking pads, the integrated circuit, the package substrate, or a combination thereof.

2. The method as claimed in claim 1 further comprising forming a package body on the integrated circuit.

3. The method as claimed in claim 1 further comprising mounting a stacked package on the stacking pad.

4. The method as claimed in claim 1 further comprising coupling an embedded integrated circuit to the flexible substrate.

5. The method as claimed in claim 1 further comprising coupling a system interconnect on the package substrate for connecting the integrated circuit, the stacking pad, or a combination thereof.

6. A method of manufacturing an integrated circuit package stacking system including:
   forming a flexible substrate by:
      providing an insulating material,
      forming an array of stacking pads on the insulating material,
      forming coupling pads on the insulating material, and
      forming traces between the stacking pads and the coupling pads including electrically connecting one of the stacking pads to one of the coupling pads for forming a circuit wherein forming the traces includes enclosing each of the circuits by the insulating material;
   providing a package substrate having a component side and a system side;
   coupling an integrated circuit to the package substrate including coupling an electrical interconnect between the integrated circuit and the package substrate;
   coupling an embedded integrated circuit to the flexible substrate including the embedded integrated circuit between the flexible substrate and the integrated circuit; and
   applying a conductive adhesive on the package substrate for positioning the flexible substrate over the integrated circuit and coupling the flexible substrate on the conductive adhesive, including connecting a component contact to the coupling pad, for forming a plurality of electrical connections through the flexible substrate between the stacking pads, the integrated circuit, the package substrate, or a combination thereof.

7. The method as claimed in claim 6 further comprising forming a package body on the integrated circuit including enclosing an adhesive between the integrated circuit and the flexible substrate.

8. The method as claimed in claim 6 further comprising mounting a stacked package on the stacking pad including coupling a chip interconnect to the stacking pad.

9. The method as claimed in claim 6 further comprising coupling a system interconnect on the package substrate for connecting the integrated circuit, the stacking pad, or a combination thereof including coupling a first stacked integrated circuit, a second stacked integrated circuit, an embedded integrated circuit, an embedded flip chip circuit, or a combination thereof.

10. An integrated circuit package stacking system including:
    a flexible substrate formed by:
       an insulating material,
       an array of stacking pads formed on the insulating material,
       coupling pads formed on the insulating material, and
       traces between the stacking pads and the coupling pads includes an electrical connection between one of the stacking pads and one of the coupling pads for forming a circuit;
    a package substrate;
    an integrated circuit coupled to the package substrate;
    an embedded integrated circuit coupled to the flexible substrate with the embedded integrated circuit between the flexible substrate and the integrated circuit; and
    a conductive adhesive on the package substrate with the flexible substrate over the integrated circuit and the flexible substrate on the conductive adhesive includes a plurality of electrical connections through the flexible substrate between the stacking pads, the integrated circuit, the package substrate, or a combination thereof.

11. The system as claimed in claim 10 further comprising a package body on the integrated circuit.

12. The system as claimed in claim 10 further comprising a stacked package on the stacking pad.

13. The system as claimed in claim 10 further comprising an embedded integrated circuit coupled to the flexible substrate.

14. The system as claimed in claim 10 further comprising a system interconnect on the package substrate with the system interconnect coupled to the integrated circuit, the stacking pad, or a combination thereof.

15. The system as claimed in claim 10 further comprising:
    a component side and a system side on the package substrate;
    an electrical interconnect between the integrated circuit and the package substrate; and
    a component contact connected to the coupling pad.

16. The system as claimed in claim 15 further comprising a package body on the integrated circuit includes an adhesive between the integrated circuit and the flexible substrate.

17. The system as claimed in claim 15 further comprising a stacked package on the stacking pad includes a chip interconnect coupled to the stacking pad.

18. The system as claimed in claim 15 further comprising a system interconnect on the package substrate connected to the integrated circuit, the stacking pad, or a combination thereof includes a first stacked integrated circuit, a second stacked integrated circuit, an embedded integrated circuit, an embedded flip chip circuit, or a combination thereof coupled to the system interconnect.

* * * * *